United States Patent [19]

Patton, III et al.

[11] Patent Number: 4,998,075

[45] Date of Patent: Mar. 5, 1991

[54] PROGRAMMABLE MULTIPLE OSCILLATOR CIRCUIT

[75] Inventors: Charles R. Patton, III, Long Beach; Timothy G. O'Shaughnessy, Norco, both of Calif.

[73] Assignee: Western Digital Corporation, Irvine, Calif.

[21] Appl. No.: 427,197

[22] Filed: Oct. 26, 1989

[51] Int. Cl.⁵ .............................................. H03L 7/00
[52] U.S. Cl. .......................................... 331/2; 331/56; 307/269
[58] Field of Search ........................ 331/2, 46, 48, 56; 307/269, 527, 529

[56] References Cited

U.S. PATENT DOCUMENTS

| | | |
|---|---|---|
| 3,139,593 | 12/1961 | Kaminski et al. |
| 3,927,384 | 12/1975 | Jezo ........................................ 331/2 |
| 4,164,629 | 8/1979 | Ollivier et al. ..................... 331/2 X |
| 4,667,168 | 5/1987 | Shiomi et al. |
| 4,667,170 | 5/1987 | Lofgren et al. |
| 4,682,362 | 7/1987 | DeFreitas et al. |

FOREIGN PATENT DOCUMENTS

| | | |
|---|---|---|
| 57-53158 | 3/1982 | Japan. |
| 58-56504 | 4/1983 | Japan. |
| 59-15334 | 1/1984 | Japan. |

OTHER PUBLICATIONS

Electronic Products, Apr. 1989, p. 81, "Motor Driver Controls up to 1.5 A and 45 V".

Primary Examiner—Robert J. Pascal
Attorney, Agent, or Firm—Christie, Parker & Hale

[57] ABSTRACT

A method for controlling a programmable source of a plurality of string of clock signals, a program is stored with a plurality of different indications of desired frequencies, each indication corresponding to one of the strings of clock signals. The frequency of each of a plurality of oscillator is controlled by the memory content of a separate memory for each oscillator. The content of each memory is adjusted in accordance with the actual frequency of each string, the frequency indicated by the corresponding indication of a desired frequency and a reference.

66 Claims, 8 Drawing Sheets

Fig. 3A

INTERNAL CONSTANT $3000_{16}$ + PRESET NO. $8B2A_{16}$ = $\underbrace{1\,1000\,1011}_{\text{10 BIT COARSE TUNE LOAD *}}\underbrace{0010\,1010_2}_{\text{10 BIT FINE TUNE LOAD **}}$

* COARSE TUNE = $\underbrace{1}_{\text{SIGN BIT}}\underbrace{1\,1000\,1011_2}_{\text{COARSE TUNE COUNT}} = -18B_{16} = -395_{10}$

** FINE TUNE = $\underbrace{1}_{\text{SIGN BIT}}\underbrace{1\,0010\,1010_2}_{\text{FINE TUNE COUNT}} = -12A_{16} = -298_{10}$

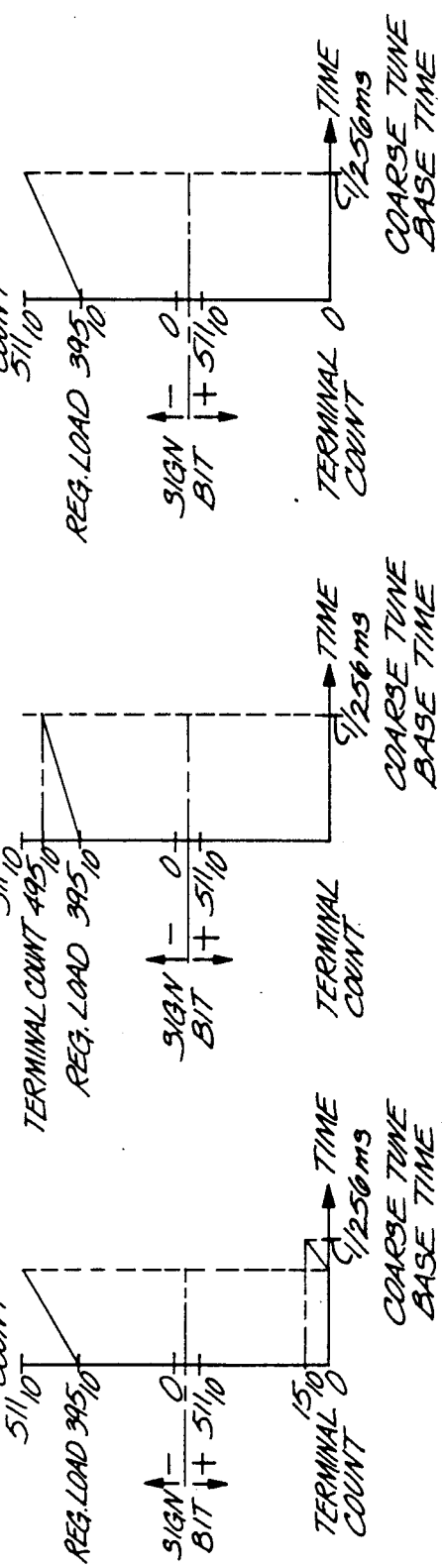
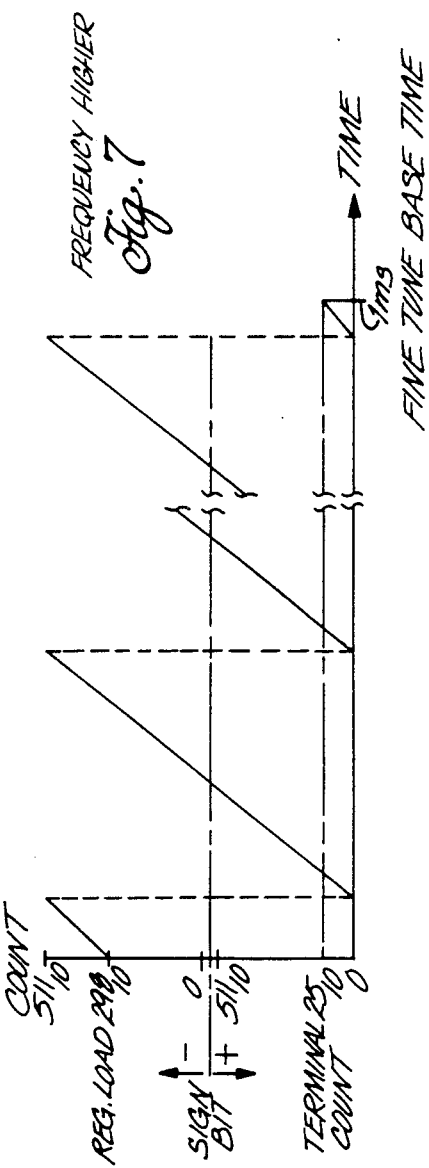

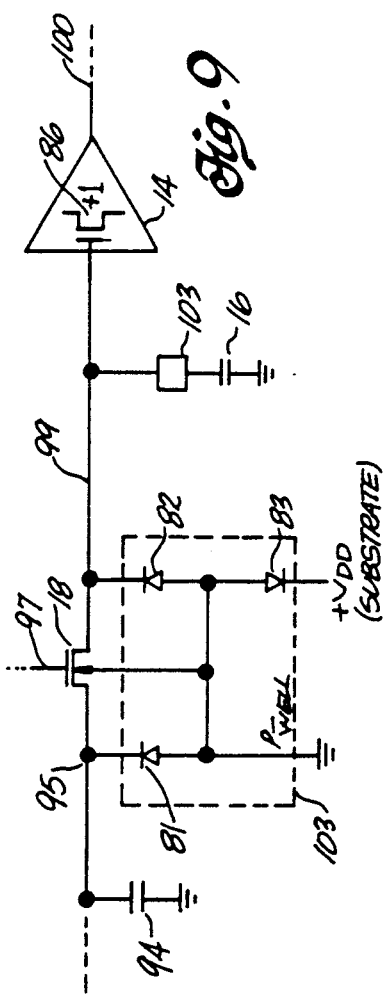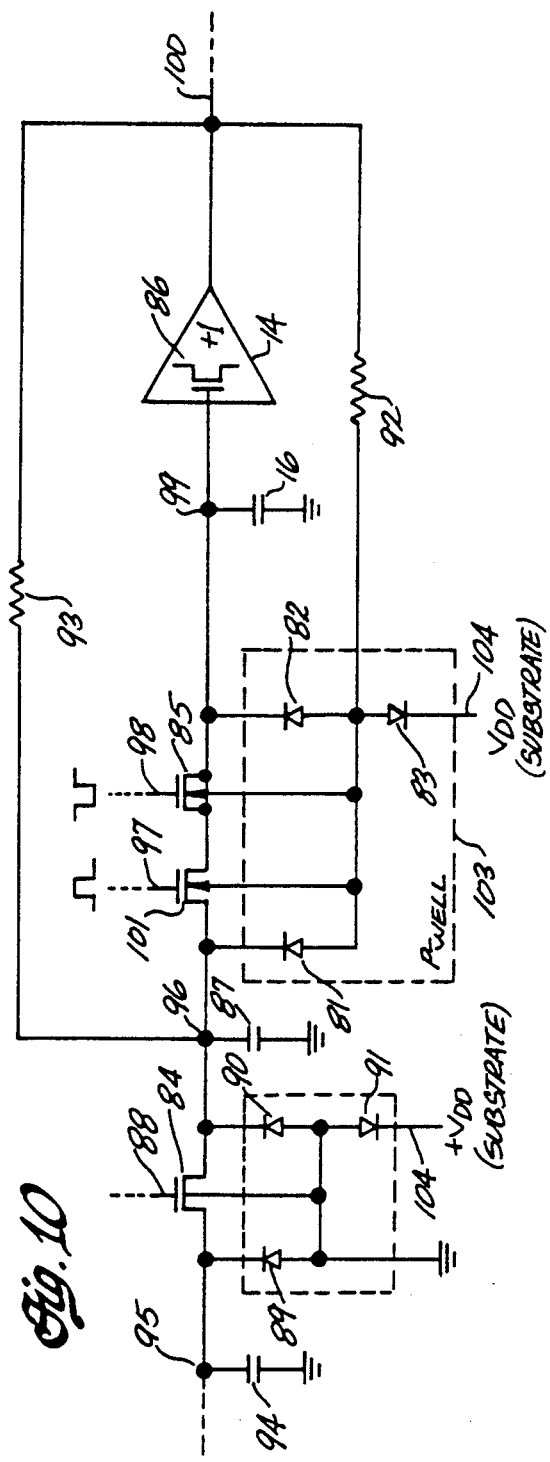

4,998,075

PROGRAMMABLE MULTIPLE OSCILLATOR CIRCUIT

FIELD OF THE INVENTION

This invention relates to the field of clock signal generators and, more particularly, to programmable multiple oscillators that simultaneously provide multiple clock signals at different frequencies.

BACKGROUND OF THE INVENTION

Electronic equipment, particularly computer equipment, frequently depends on clock pulses of a stable frequency to control various functions. However, with increasing component density and multiple functions on one board there is a need for multiple clock frequencies. For example, new hard and floppy disk drive controllers with serial and parallel I/O ports on one board for use with a microcomputer may require five or more different clock frequencies, none of which may be available from the central processing unit or its peripherals.

Multiple clocks with different frequencies must normally be generated by different oscillators, each with a crystal as a reference. Crystal oscillators are expensive and large, and therefore, consume large amounts of board area. Phase lock loops can also generate multiple clocks of different frequencies from a single reference source such as a crystal oscillator and a voltage controlled oscillator (VCO). Although these circuits are also generally quite large, they can be formed and reduced in size in an integrated circuit (IC) with other circuitry. However, typical VCOs require a control circuit with pads to external resistors, capacitors, individual oscillator components, and a reference oscillator. Such control circuitry and pads require space, as do the external components. In addition, VCOs generate frequency modulated noise which can disturb other computer functions and contribute to electromagnetic interference (EMI) problems.

Control circuits are also known which compare the frequency of a VCO to a desired frequency and transmit the difference in digital form to a digital to analog converter to control the VCO. However, these circuits generally are not flexible and require a large number of parts for a single VCO. Other clock circuits are known which are generally inflexible.

SUMMARY OF THE INVENTION

The present invention overcomes the shortcomings in the prior art. An embodiment of the present invention is a method for controlling a programmable source of a plurality of strings of clock signals. A program is stored with a plurality of different indications of desired frequencies, each indication corresponding to one of the strings of clock signals. The frequency of each of a plurality of oscillators is operated in accordance with the memory content of a separate memory for each oscillator. Each oscillator, thereby, forms a different one of the strings The frequency of each string is compared with the frequency indicated by the corresponding indication of a desired frequency. The memory content of the memory for each oscillator is adjusted for the oscillator forming the corresponding string in accordance with the results of the comparison with such string.

BRIEF DESCRIPTION OF THE DRAWINGS

FIG. 3A depicts the format of the coarse load count and fine load count values, forming the designated frequency value stored in one register of the RAM of FIG. 3;

FIG. 4 is a graphical representation of the operation of the count of the programmable multiple oscillator of FIG. 3 in a coarse tune cycle when the oscillator frequency is too high;

FIG. 5 is a graphical representation of the operation of the count of the programmable multiple oscillator of FIG. 3 in a coarse tune cycle when the oscillator frequency is too low;

FIG. 6 is a graphical representation of the operation of the count of the programmable multiple oscillator of FIG. 3 in a coarse tune cycle when the oscillator frequency is as desired;

FIG. 7 is a graphical representation of the operation of the programmable multiple oscillator of FIG. 3 in a fine tune cycle when the oscillator frequency is too high;

FIG. 9 is a schematic and block diagram of a sample and hold circuit for use in the programmable multiple oscillator of FIG. 3 where the memory capacitor is subject to leakage;

FIG. 10 is a schematic and block diagram of a preferred sample and hold circuit for use in the programmable multiple oscillator of FIG. 3 wherein leakage of the memory capacitor has been minimized with feedback paths including guarding, pre-charging, and charge balancing;

DETAILED DESCRIPTION OF THE INVENTION

Computer Systems Embodying Programmable Multiple Oscillator

Figure 1:
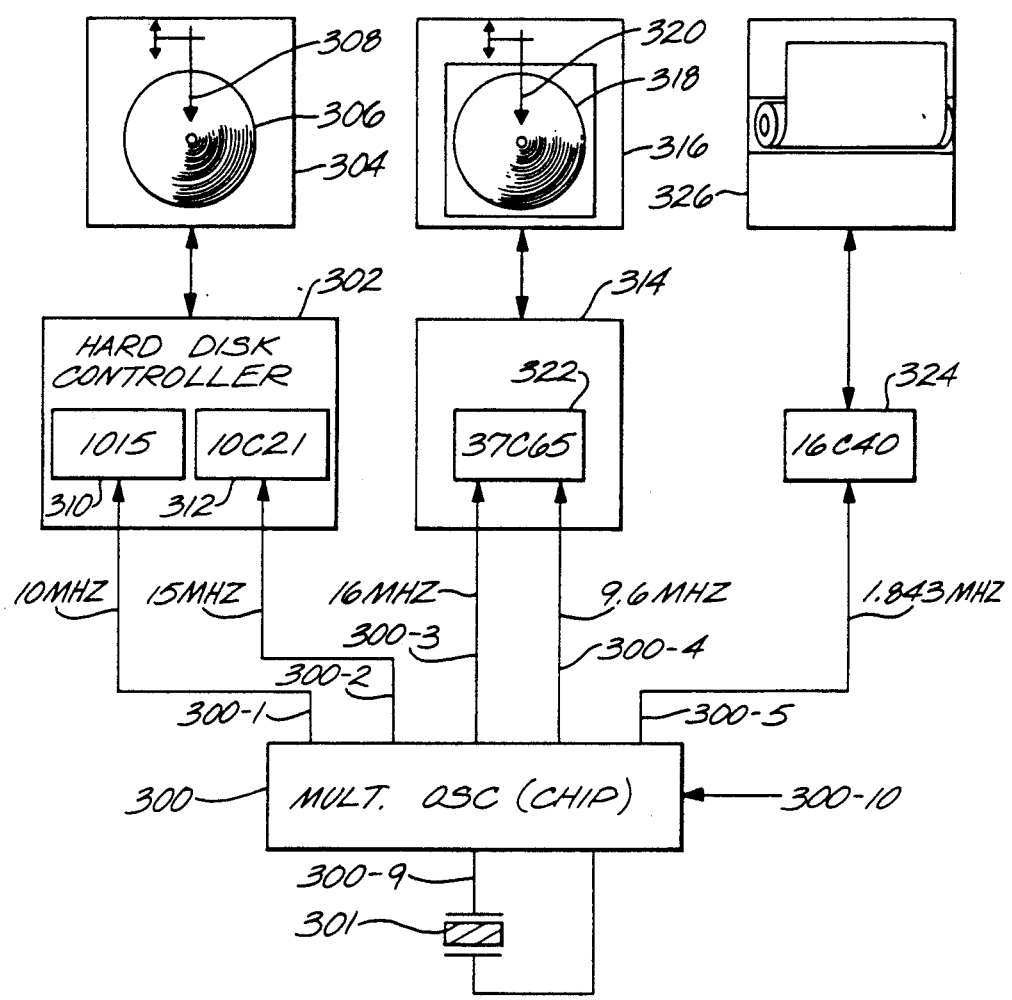
FIG. 1 is a block diagram of a computer system, including a programmable multiple oscillator and embodying the present invention.

FIG. 1 depicts a block diagram of a portion of a computer system requiring five different frequencies of clock signals. Included in the system of FIG. 1 is a programmable multiple oscillator 300, embodying the present invention, having eight outputs, only five outputs 300-1 through 300-5 being shown. At each output a string of clock signals is formed. The clock signals at each output may be at a different preprogrammed frequency, determined by a program, loaded into the programmable multiple oscillator 300 via input port 300-10 or loaded from an internal ROM at power up. To be explained in more detail, each of the clock signals at each output is a string of clock signals or pulses which are equally spaced and reoccurring. The programmable multiple oscillator 300 utilizes, as a reference, reference signals received at input 300-9 from a conventional crystal reference 301. Programmable multiple oscillator 300 will be described in more detail.

The outputs 300-1 and 300-2 are connected to the clock input of a hard disk controller 302 which, in turn, controls head positioning functions and read/write functions in a hard disk drive 304, having a rotating magnetic recording disk 306. The hard disk drive 304 is a conventional disk drive for personal computers and the disk 306 has a magnetic recording surface with concentric tracks in which head 308 records and reads signals representing data, address and other control information. The head 308 is positioned with respect to any one of a plurality of concentric tracks by means of a positioning servo and motor (not shown) The hard disk controller 302 contains a processor, by way of example the Western Digital Corporation 1015 Processor Chip; which processes address information for use in controlling head positioning in the disk drive. The hard disk controller also includes a data separator 312, by way of example the Western Digital Corporation 10C21 Chip, which takes bits of data derived from the signals read from the disk by head 308, organizes them into bytes for transfer to a host computer and formats bits of data received from a host computer for writing on the disk via read/write head 308. The processor 310 and the data separator 312 require, respectively, a ten Megahertz (MHz) clock from output 300-1 and a fifteen MHz clock from output 300-2, as the clock frequencies for sequencing the operation of these circuits.

Outputs 300-3 and 300-4 from the programmable multiple oscillator, are connected to a circuit 322 in a floppy disk controller 314. The floppy disk controller 314 is, in turn, connected to a conventional floppy disk drive 316, having a drive motor (not shown) for rotating a floppy magnetic recording disk 318. Disk 318 has magnetic recording surfaces on which signals are recorded in concentric tracks by a radially movable read/write head 320.

The circuit 322, by way of example, the Western Digital Corporation 37C65 Chip, includes a processor and a data separator, performing functions similar to that noted above for circuits 30 and 312 in the hard disk controller 302. The processor and data separator in the chip 322 operate at one of two clock frequencies, 16 MHz and 9.6 MHz, which are provided at outputs 300-3 and 300-4, respectively, of the programmable multiple oscillator 300.

Output 300-5 is connected to serial I/O port 324 for impact printer 326. The printer 326 is a conventional printer for personal computers. The serial I/O port 324 is, by way of example the Western Digital Corporation 16C40 Chip for transferring data serially from a host computer (not shown) to the printer for printing. The chip requires a 1.843 MHz clock from output 300-5.

Using current technology, the five different frequencies of clocks provided to circuits 310, 312, 322 and 324 would require five crystals and ten capacitors or five package oscillators. The programmable multiple oscillator 300 of the present invention, can be made on a single chip and only requires the single crystal 301, resulting in a substantial saving in space and cost. Each crystal and support capacitors, and especially package oscillators, are quite costly and, therefore, the reduction to a single crystal results in a substantial saving in cost. Additionally, when a new frequency is required, a crystal must be ordered and, as it is generally a custom part, requires hand tuning to achieve the desired frequency. This results in delay and is costly. By way of contrast, the programmable multiple oscillator circuit of the present invention, using a single crystal, can be programmed for any of a number of desired frequencies quickly and easily in the circuit.

Figure 2:
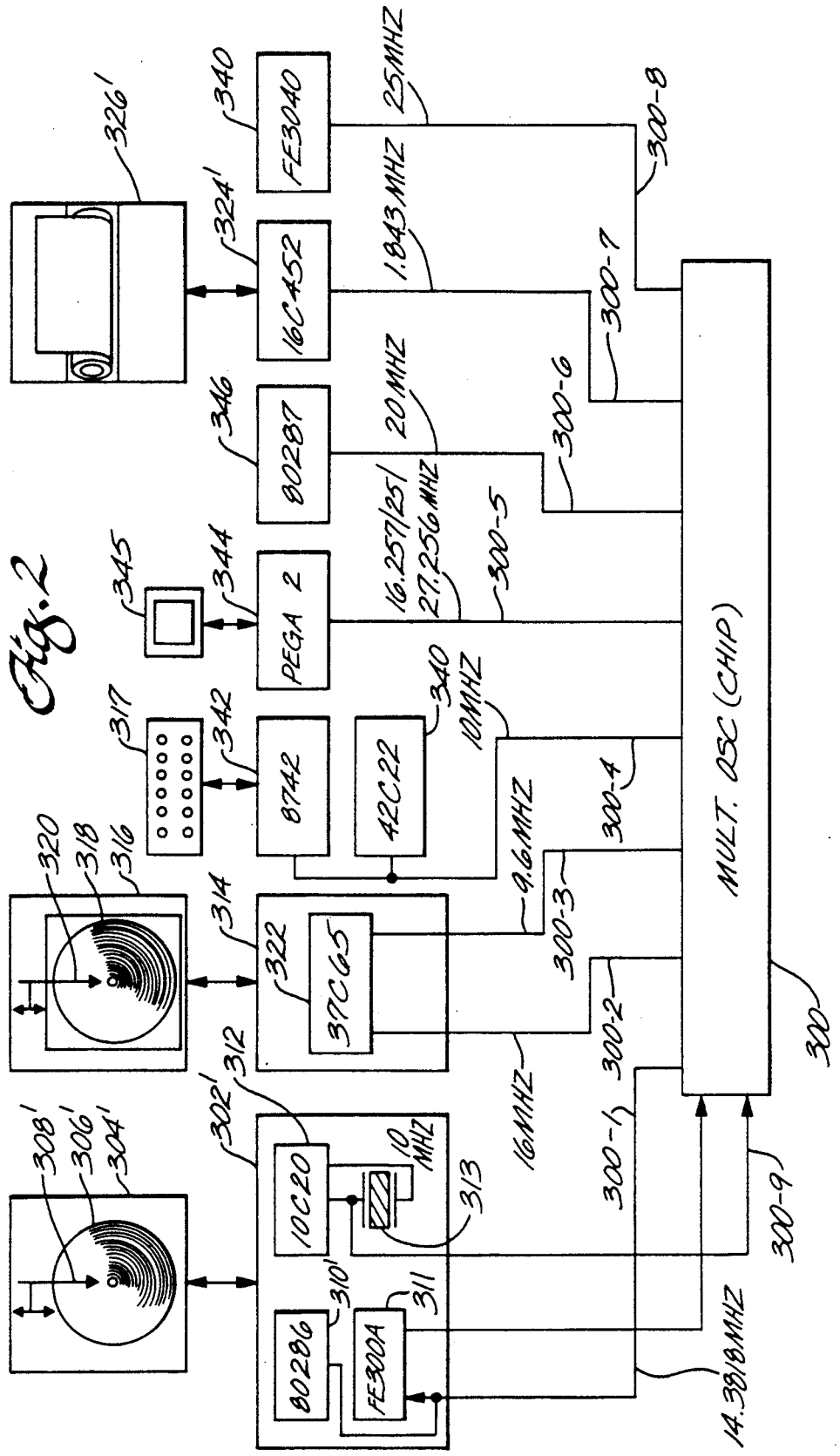
FIG. 2 is a block diagram of an alternate computer system, including the programmable multiple oscillator and embodying the present invention.

FIG. 2 depicts a portion of another computer system, using the programmable multiple oscillator 300 for clock signals. The programmable multiple oscillator 300 is the same as that depicted in FIG. 1, but all eight outputs 300-1 through 300-8 are shown. FIG. 2 includes a hard disk controller 302' which, in turn, is connected to hard disk drive 304', having a hard disk 306' and read/write head 308', which are essentially the same as devices 302, 304, 306 and 308, respectively, of FIG. 1. However, the hard disk controller 302' has a processor 310' performing similar functions to that described hereinabove for processor 310, but is by way of example the Intel Corporation 80286 CPU chip that requires a 14.3818 MHz clock. Interface logic 311, sometimes referred to as "glue logic", provides an interface between a host computer (not shown) and the processor chip 80286. The interface circuit 311 is, by way of example the Faraday Corporation FE300A Processor Chip Both the 80286 and the FE300A chips require a 14.3818 MHz clock signal, which is provided at output 300-1 of the multiple oscillator 300. Data separator circuit 312 is included in the circuit 302' and is identical to that of FIG. 1. However, as depicted in FIG. 2, the Western Digital 10C20 data separator chip used in circuit 312 has a clock input for connection to a 10 MHz crystal reference 313. Since the crystal 313 is normally provided together with the 10C20 chip, it is possible to connect the crystal 313 to the input 300-9 of the programmable multiple oscillator 300, using this crystal as the reference, saving the cost of another crystal reference.

A floppy disk controller 314, has a processor and data separator circuit 322 and is connected to a floppy disk drive 316 having read/write head 320 containing a drive (not shown) for floppy disk 318, all essentially the same as that described with reference to FIG. 2 and using the same reference numerals. Outputs 300-2 and 300-3 of the programmable multiple oscillator 300 are connected to the circuit 322 for providing 16 MHz and 9.6 MHz clock signals.

A keyboard processor 342 processes signals from a conventional keyboard 317 for the computer system. Circuit 342 is, by way of example the Intel Corporation microprocessor (uP) 8742 chip Controller circuit 340 is by way of example the Western Digital Corporation 42C22 interface chip for interface to a hard disk drive. Each of the clock inputs of chips in circuits 340 and 342 are connected to output 300-4 from the programmable multioscillator for receiving a 10 MHz clock signal.

A graphics controller circuit 344, by way of example the Paradise Corporation PEGA 2 Chip, is a single chip video controller that is compatible with the IBM Enhanced Graphics Adaptor (EGA) conventions The PEGA 2, with a BIOS read only memory (ROM), a CRT display terminal 345, memory (not shown) and interface logic of a personal computer, provides a high performance video display, having a resolution of 640 picture elements by 648 lines on the CRT display. PEGA 2 requires depending on its mode of operation, 16.257, 25 or 27.256 MHz clock signals. These three signals are formed at different times, under program control, at output 300-5 from the programmable multiple oscillator 300.

Microprocessor 346, by way of example, a mathcoprocessor chip 80287 manufactured by the Intel Corporation, which requires a 20 MHz clock, is connected to output 300-6 of the programmable multiple oscillator. Serial I/O port 324' is connected to impact printer 326' and are essentially the same as devices 324 and 326 of FIG. 1. The serial I/O port 324' is, by way of example, the Western Digital Corporation 16C452 Chip requiring a 1.843 MHz clock from output 300-7. Interface logic circuit 348, by way of example the Faraday Corporation FE3040 Chip, requires a 25 MHz clock from output 300-8.

Each of the chips 310', 311, 312, 313, 322, 340, 342, 344, 346, 324' and 326' and 342 are mounted on a common back plane or circuit board called a mother board forming a part of a personal computer.

Using conventional techniques, packaged oscillators are required for generating each of the different frequencies for the chips depicted in FIG. 2. A total of 9 different packaged oscillators are required. By way of contrast, using the programmable multiple oscillator 300 of FIG. 2, the 9 packaged oscillators and corresponding capacitors are replaced with a single chip and a crystal or, as indicated in FIG. 2, the crystal utilized with the 10C20 chip can be used as the reference.

Programmable Multiple Oscillator

Figure 3:
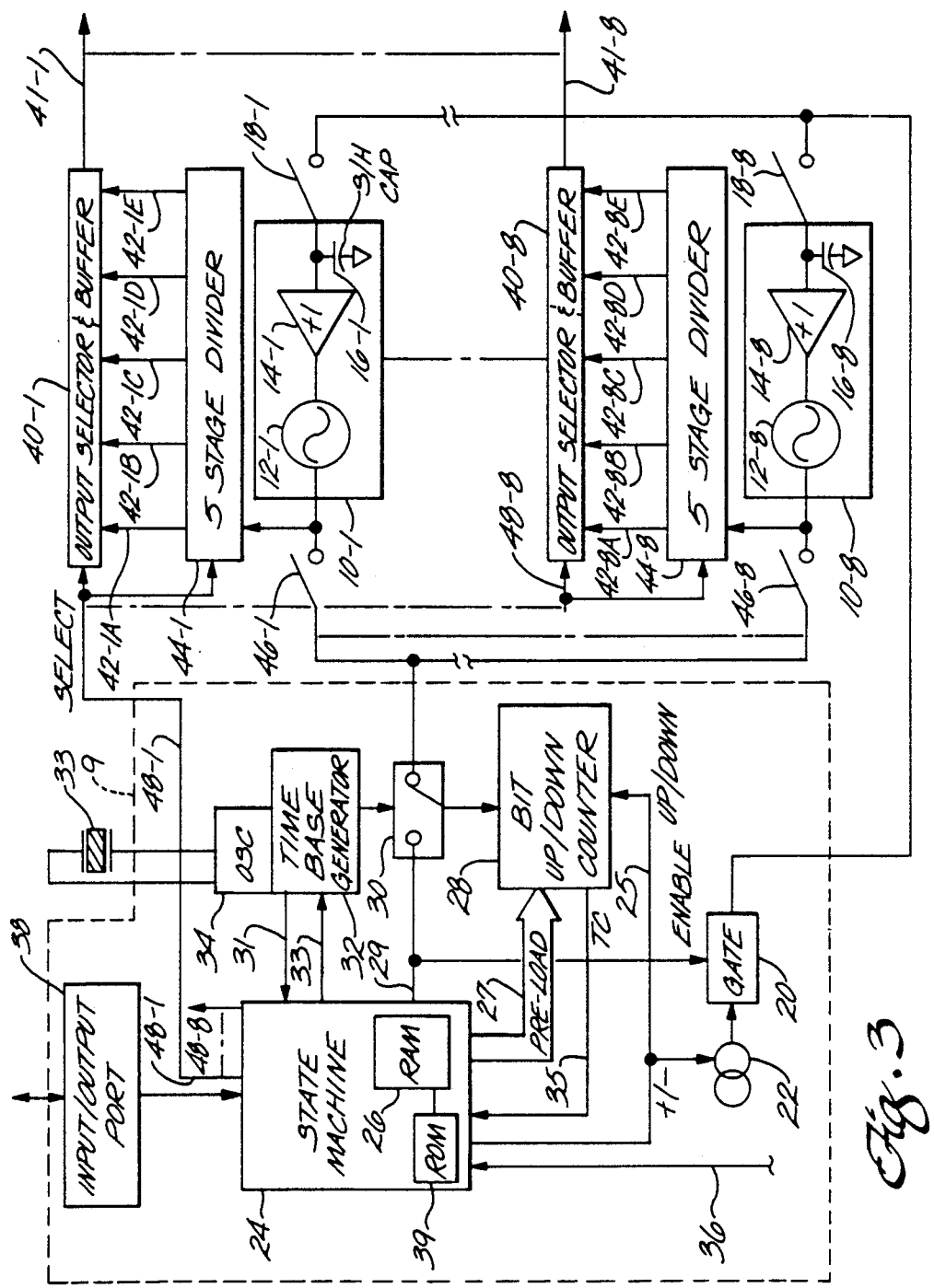
FIG. 3 is a schematic and block diagram of the programmable multiple oscillator, and embodies the present invention.

Refer now to the programmable multiple oscillator of FIG. 3 and embodying the present invention. Multiple clock pulse or clock signal strings are formed at each of its eight outputs 41-1 to 41-8 (only 41-1 and 41-8 are shown by way of example). Outputs 41-1 to 41-8 correspond to outputs 300-1 through 300-8 of FIGS. 1 and 2. Each clock signal string is produced by one of eight oscillator circuits 10-1 to 10-8 (only 10-1 and 10-8 are shown by way of example). Preferably, each oscillator circuit includes a corresponding one of eight delay line voltage controlled oscillators (VCOs) 12-1 to 12-8 (only 12-1 and 12-8 are shown by way of example). Copending application Ser. No. 06/916,404, Filed Oct. 7, 1986, and assigned to the same assignee as the present application, the disclosure of which is incorporated herein by reference, describes a delay line suitable for use as a VCO. However, other variable frequency oscillators known in the art may be used.

Each of oscillator circuits 10-1 to 10-8 also includes a corresponding one of eight conventional operational amplifiers 14-1 to 14-8 (only 14-1 and 14-8 are shown by way of example), the output of which provides a bias voltage that controls the corresponding VCO. The control input to each amplifier is connected to a corresponding one of eight analog memories 16-1 to 16-8 (only 16-1 and 16-8 are shown by way of example). Preferably, each memory is a memory capacitor. One side or plate of each capacitor is directly connected to the input of the corresponding operational amplifier 14-1 to 14-8, and the other plate of each capacitor is connected to ground potential. An improved version explained in connection with FIG. 12 drives the lower plate from a controlled gain amplifier, each memory capacitor with amplifier resulting in an electronically multiplied capacitance.

A buffered digital to analog converter, which produces a voltage signal in response to the value stored in the buffer could be used in place of each capacitor memory. However, as greater than 16 bits of resolution is required, the cost and space required would likely be prohibitive relative to a capacitor memory.

Oscillator circuits 10-1 to 10-8 are sequentially scanned and regulated by frequency controller 9. The input of each of the memories 16-1 to 16-8 is sequentially connected through a corresponding one of eight semiconductor switches 18-1 to 18-8 (only 18-1 and 18-8 being shown by way of example), respectively, to a current source 22, through a common or shared gate 20. To be explained, the current source 22 and gate 20 periodically make corrections in the content of each memory capacitor by adding or removing charge and thereby correcting the frequency out of the corresponding VCO. Each of memories 16-1 to 16-8, and the corresponding one of the switches 18-1 to 18-8, form a sample and hold circuit.

The state machine 24 includes random access memory (RAM) 26 containing 8 registers (not shown), one register corresponding to each of the oscillators 10-1 to 10-8. In a preferred embodiment, the registers each contain 16 bits of storage, which allows for a frequency resolution of 0.0015% (1 part in $2^{16}$). Each of the registers in the RAM is loaded with a signal, having coarse tune load and fine tune load portions, which forms an indication of the desired frequency of the corresponding oscillator 10-1 to 10-8. The RAM registers can be loaded with indication of the desired frequency either from the input/output port 38 or from values stored in a read only memory (ROM) 39.

An example of how a typical frequency would be figured and the corresponding frequency indication would be derived and generated would be as follows. Assume the VCO 12-1 covers a range of 20 Megahertz (MHz) to 40 MHz and the desired output frequency is 29.910 MHz. If the fine tune time base interval is 1 millisecond (ms) and the coarse time base interval is 1/256 ms then 29910 counts would be counted total in the fine tune time base interval.

This is:

$$29910_{10} \text{ counts} = 74D6_{16} \text{ counts}$$

The twos complement of this value gives the number to put in the RAM register 26. The complement is based on a sixteen bit register so that two ten bit values with a two bit overlap are obtainable.

$$1000_{16} \text{ counts} - 74D6_{16} \text{ counts} = 8B2A_{16} \text{ counts}$$

The format of the ten-bit coarse and fine loads which are formed are depicted in FIG. 3A.

The value stored in each RAM register is 16 bits from which the 10 bits of the coarse and fine tune loads are formed as indicated in FIG. 3A. Either the coarse tune load or the fine tune load depicted in FIG. 3A derived from one of the RAM registers, is loaded by the state machine to 10-bit up/down counter 28 in controller 9 over pre-load bus 27 for frequency adjustment. The two high order 1 bits of the coarse tune load, the highest order bit being a sign bit, are loaded into the counter 28 from logic (not shown) when loading the coarse tune load. The fine tune count plus a 1 sign bit are loaded into the counter 28.

The counter 28 is connected through a semiconductor switch 30 to each of eight semiconductor switches 46-1 to 46-8 (only 46-1 and 46-8 being shown) the input of each of which is connected to the output of a corresponding one of the VCOs 12-1 to 12-8, respectively.

The switch 30 is controlled by time base generator 32. Together, switch 30 and generator 32 form a time base gate which control the length of time pulses from any one of the VCOs 12-1 to 12-8 are applied to counter 28 and the length of time that pulses (to be described) from state machine 24 are applied to counter 28.

The time base generator 32 is regulated by time reference pulses from a reference oscillator 34. The reference oscillator 34 may be a crystal oscillator controlled by reference crystal 33, or may be any other stable self-regulating oscillator that puts out a continuous string of regular reoccurring clock signals or pulses. Oscillator 34 is preferably integrated into a common semiconductor circuit chip with the rest of the components of FIG. 3 requiring only a single external crystal.

The time period during which the time base generator couples each of these clock signals to the counter 28 is selected by control signals on line 33 by the state machine 24.

In the present embodiment, the output of each VCO 12-1 to 12-8 is connected to a corresponding one of eight five-stage divider strings 44-1 to 44-8, respectively (only 44-1 and 44-8 being shown). Each divider string is a set of five flip-flops (not shown) connected in series to form a simple basic asynchronous ripple counter as is well known in the art. A tap is connected to the output (not shown) of each of the flip-flops in each of dividers 44-1 through 44-8. The taps for each divider are identified by the symbols 1A through 1E preceded by the number of the corresponding divider. The output selector and buffers 44-1 to 44-8, under the control of select lines 48-1 through 48-8 (only lines 48-1 and 48-8 being shown), from state machine 24, control which one of the taps, from the corresponding divider, is connected to the corresponding one of outputs 41-1 to 41-8. In addition to controlling selection of taps, the select lines 48-1 through 48-8 may also disable any one of the dividers 44-1 through 44-8 selector and buffers 40-1 through 40-8. The clock signals at the taps selected by the select lines 48-1 through 48-8 are transmitted through the corresponding output selector and buffer 40-1 through 40-8 to the external components, which the clock signals are intended to control.

The state machine 24 is controlled and programmed through a one-bit power on and reset line 36 and input-/output (I/O) port 38. The I/O port may be either a parallel or serial port If the I/O port 38 receives serial signals, it may include a serial to parallel shift register to form parallel signals for the state machine 24.

The reset line 36 and I/O port 38 are connected to a host computer (not shown), for example, the central processing unit of a microcomputer. The I/O port 38 can be dispensed with, and the state machine made to act independently whenever power is turned on. In such a case the RAM 26 registers are loaded from ROM 39.

Preferably, the state machine 24 is arranged to initially load the indications of the desired frequency from the ROM 39 into RAM 26 registers upon receiving a power up signal on line 36. This allows start up of the oscillators on a known set of frequencies and thereby the system in which the multiple oscillator is used. Subsequently, the final desired indications of the desired frequency are provided through input/output port 38 and are loaded into the RAM registers.

Consider now the operation of the programmable multiple oscillator of FIG. 1. Preferably, the state machine has logic or program which upon power up, causes a preprogrammed set of initial frequency indications stored in ROM 39 to be loaded into the RAM 36. A full complement of all frequency indications is not necessary. Instead, it is only necessary to provide frequency indications for those parts of the system that are added to initially start up the computer system of FIGS. I or 2, such as one of the processors and VGA or CGA circuits. After that processor is running at the initially set frequency, the processor can be arranged to cause the full complement of correct frequency indications to be loaded into the RAM via port 38. After being programmed by loading the desired frequency indications into the registers of RAM 26 for each oscillator, the controller 9, which preferably includes the switches 46-1 through 46-8 and 18-1 through 18-8, sequentially scans the oscillator memories and adjusts its memory content in accordance with the corresponding frequency indication in the corresponding registers in RAM 26. This is done under control of the clock signals from the corresponding oscillator and the time base generator 32.

More specifically, the oscillator circuits 10-1 through 10-8 are sequenced in order, beginning with 10-1, as each oscillator circuit is scanned, the corresponding switch 46 is closed connecting the clock signals from its VCO to gate 30 and the corresponding switch 18 is closed connecting its memory to charge and discharge signals from gate 20.

Assume the state machine 24 closes switches 46-1 and 18-1 for oscillator 10-1. The state machine applies a signal on line 33, setting the time base generator for a coarse tune time period for a coarse tune cycle and loads up/down counter 28 with the coarse tune count (see FIG. 3A) derived from the RAM 26 register that corresponds to oscillator 10-1. Time base generator 33, sequenced with clock pulses from oscillator 34, causes switch 30 to connect the output of switch 46-1 to the count input of up/down counter 28. Simultaneously, the state machine 24 applies an up count control signal on line 25, causing up/down counter 28 to count up one state for each clock signal from the oscillator 10-1. The time base generator 32 maintains the connection of switch 30 until the coarse tune time period expires, at which time, time base generator 32 causes switch 30 to disconnect switch 46-1 and connect line 29 to up/down counter 28. Time base generator also applies a signal on line 31 to the state machine 24 indicating that the coarse tune time period has ended. At this time, the up/down counter 28 has a count indicative of the frequency from the VCO of oscillator 10-1.

The state machine then enables the up/down counter 28 to either count up or down depending on the sign bit on line 35. The state machine applies pulses on line 29, which both count the up/down counter 28 in the direction indicated on line 25 and causes the gate 20 to apply charge or discharge signals from current source 22 through the closed switch 18-1, to charge or discharge the memory capacitor which, in turn, changes the signal to VCO of oscillator 10-1, causing it to move closer to the desired frequency. The count of the pulses on line 29 by counter 28 are called error counts. The pulses from the state machine on line 29 continue until the sign bit from up/down counter 28 changes state, at which point the pulses on line 29, the charging or discharging of the memory capacitor and the counting of the counter terminate.

The coarse tune operation is then repeated sequentially for oscillators 10-2 through 10-8 in a similar manner to that described above with respect to oscillator 10-1, but using the coarse tune load from the register of RAM 26 corresponding to the oscillator being scanned. When the error count is less than or equal to 1 for a particular oscillator, then during the next cycle through the oscillators, the system goes to a fine tune cycle for that oscillator.

The operation during the fine tune cycle is similar to that for the coarse tune cycle, except that (a) the fine tune base interval, during which time base generator 32 maintains the connection from the switches 46 to the up/down counter 28 through switch 30, is increased preferably by a factor of 256, (b) the fine tune load count from the indications from RAM 26 register for the oscillator being scanned is loaded into up/down counter 28 and (c) pulses applied to gate 20 on line 29 are made narrower, decreasing the amount of charging or discharged current through gate 20 to the memory capacitors.

Each counter 28 has a 10 bit counter and has a binary operation. Such a counter would have a capacity of 512 counts plus sign. However, the counter 28 could be any length from 3 bits to 18 bits or more. The shorter the length, the faster the time for closure to the desired performance, but the more complex the state machine 24 and the current source 22 control.

Consider now the operation during the coarse tune cycle in more detail.

FIGS. 4-7 illustrate in graph form the operation of the comparator, including the up/down counter 28 for three different cases of the coarse tune cycle.

FIG. 4 is for the case where the oscillator being scanned is oscillating at a higher than desired frequency and the desired coarse tune count represents 395. The coarse tune count representing 395 plus a 1 sign bit are loaded into the counter 28 by the state machine 24. The counter, counting pulses from one of the oscillators, counts up, starting at the beginning of the coarse tune base period to a maximum count of 511, then back to zero causing a positive sign bit, i.e., a 0 bit on line 35, and continues counting up to 15. When the time base generator 32 ends the coarse tune base period, switch 30 disconnects the oscillator 12 from the counter 28 stopping the count. Therefore, the terminal or error count in counter 28 and is greater by 15 counts than the desired terminal count of 0.

The positive terminal sign bit of 0 on line 35 indicates that the oscillator being scanned produced more pulses during coarse tune base period than desired. Therefore, the positive sign bit on line 35 causes the state machine to set the up/down line 25 to down, applies pulses on the enable line 29 through gate 30 to the count input of counter 28, counting the counter 28 down and causes the current source 22 to supply a negative current to the gate 20. Each pulse transmitted on the enable line 29, in addition to counting the up/down counter 28 down one count causes the gate 20 to send a negative current pulse through the closed switch 18 to the memory capacitor 16 of the oscillator being scanned. Each negative current pulse decreases the charge on the memory capacitor 16 by one unit, which decreases the voltage applied to the operational amplifier 14, decreasing the voltage to the VCO 12, and in turn decreasing the VCO 12 clock signal frequency.

Since counter 28 is initially at an error count of 15, after 16 pulses on line 29, the counter 28 is counted from a positive count of 15 through count 0 to count 511 where a negative sign bit appears on the terminal count line 35 causing the state machine to stop applying pulses on the enable line 29. In order to adjust for one additional count than desired, i.e., 16 rather than the desired count of 15, the first count of any 'down' adjustment process does not enable the current source 20. The adjustment in charge on the memory capacitor 16, as a result of this process, is directly controlled by the terminal count and is directly proportional to the difference between the desired terminal count of 0 and the actual terminal count, i.e., 15, at the end of the coarse tune base period.

Consider now the example of FIG. 5 where the oscillator 10 is operating at a lower frequency than the 395 value of the coarse tune count in up/down counter 28. The terminal or error count of counter 28 at the end of the coarse tune base period is 495, 17 less than the desired terminal count of 0 and the sign bit on line 35 is negative, i.e , 1. This indicates that the oscillator 10 has produced fewer pulses than that desired during the coarse time base interval, i.e., that its frequency is too low. The negative sign bit on line 35 causes the state machine 24 to set the up/down line 25 to up, sets the current source 22 so that it applies a positive or charging current to the memory capacitor 16 and then applies pulses on line 29. Each pulse on line 29 causes gate 30 to couple a pulse of positive or charging current to the memory capacitor 16 increasing its charge, increasing the voltage to VCO 12 and hence the frequency of the clock signals from the VCO. After the state machine 24 has transmitted 17 pulses on the enable line 29, counter 28 is 0, and the charge on the memory capacitor 16 will have increased the frequency of the VCO 12.

Consider the example of FIG. 6 where the frequency from oscillator 10 is exactly at the frequency indicated by the coarse tune count of 395. The terminal count of up/down counter 28 at the end of the coarse tune base period is 0 with a positive sign bit, i.e., a 0. A 0 terminal count means that no adjustment to the memory capacitor and the VCO frequency is necessary in the coarse tune cycle. Therefore, the state machine 24 sets the up/down line 25 to down and transmits one pulse on the enable line 29 causing the counter to go to be reset to 511 and the terminal count line 35 to go negative, i.e., a 1. No charge or discharge is provided to the memory capacitor, i.e., the first down pulse does not enable the current source.

The state machine 24 is arranged so that it monitors the number of pulses (i.e., the error count) required on line 29 during a coarse tune cycle before the sign from the up/down counter 28 changes and stores a 1 bit in a unique location (not shown) in RAM 26 for each oscillator 10 that requires more than one count and stores a 0 bit in the same location if 1 or no count is required. If more than one pulse is required during a coarse tune cycle for any oscillator, and the value so indicating is stored for that oscillator, the coarse tune cycle for that oscillator is repeated during the next scan of that oscillator. If one or no count is required in a coarse tune cycle during one scan of an oscillator, then during the next scan of that oscillator a fine tune cycle is entered.

During a fine tune cycle for any oscillator, the fine tune count for that oscillator is loaded into the up/down counter 28.

Consider the fine tune cycle operation for one of the oscillators 10. First, the state machine loads the fine tune count plus a 1 sign bit from the RAM register corresponding to that oscillator into the up/down counter 28. The appropriate switches 46 and 18 are closed, and the up/down counter 28 counts the pulses from the VCO in the oscillator 10 being scanned. For the fine tune cycle, the fine tune time base is $2^8$ or 256 times longer than for the coarse tune cycle and, therefore, time base generator 32 causes switch 30 to allow pulses to pass to up/down counter 28 for a time interval that is $2^8$ times longer than the time base period for the coarse tune cycle. As a result, the error or terminal count is a residual module count with $2^8$ times greater resolution than what the error or terminal count would be if the coarse tune time base period were used. This allows a greater resolution with the same size counter.

FIG. 7 illustrates the operation for the fine tune cycle for a case in which the oscillator frequency is too high.

Assume that a fine tune count of 298 is loaded in up/down counter 28. The counter 28 counts the pulses from the oscillator being scanned passing through 511, back to 0, repeatedly until the fine tune time base period ends.

In the example of FIG. 7, the error or terminal count at the end of the fine tune time base period exceeds the desired terminal count of 0 by 25 counts with a positive sign bit, i.e., 0, on line 35. As with the coarse tune cycle in the example of FIG. 4, this indicates that the oscillator frequency is too high. Accordingly, as with the coarse tune cycle, the state machine 24 sets an up a signal on line 25, sets the current source 22 so that it discharges the memory capacitor, and begins sending pulses over line 29 counting the up/down counter 28 down through 0 back to 511 causing the sign bit signal on line 35 to go to negative, i.e., 1. Each pulse on line 29, except the first one, opens the gate 20, allowing a negative current pulse to discharge the memory capacitor 16, and thereby decrease the frequency of the VCO 12 in the oscillator being scanned.

The fine tune cycle differs from the coarse tune cycle, however, in that the pulses sent over the enable line 29 by the state machine 24 are much narrower for the fine tune cycle than they are for the coarse tune cycle. In the coarse tune cycle of FIG. 4, the terminal count of 15 means that 15 counts more than the desired 117 counts were received by the up/down counter 28, a 3.2% difference. In the fine tune cycle of FIG. 7, the terminal count of 25 means that 25 counts more than the desired 29,910 were received, a 0.084% difference. The 15 pulses that adjust the charge on the memory capacitor 16 for the coarse turning cycle of FIG. 4 must, therefore, provide far more current in order to make a 3.2% adjustment than the 25 pulses that adjust the memory capacitor for the fine tuning cycle of FIG. 5, which makes a 0.084% adjustment. Accordingly, each pulse transmitted by the state machine 24 on line 29 during the coarse tune cycle is 256 times the width of the pulse on line 29 for the fine tune cycle. Alternatively, the current source 22 could be constructed to supply less current per pulse during the fine tune cycle than during the coarse tune cycle.

The state machine repeats the coarse tune cycle for an oscillator only until the error count for that oscillator is within a certain tolerance, i.e., 1 of the desired 0 count. The fine tune cycle then becomes useful. After an oscillator is within the tolerance, the state machine continually repeats the fine tune cycle for any oscillator that is within tolerance for as long as that oscillator is operating. This maintains the frequencies as close to the desired frequency as possible. Of course, if the frequency range of the VCOs is small, or the accuracy of the frequency is not critical, either the coarse tune cycle or the fine tune cycle may be eliminated.

Using a state machine to control the oscillators allows great flexibility. The state machine may also be designed to return to the coarse tune cycle for any oscillator whenever the fine tune terminal count exceeds the tolerance. It can also be designed to transmit a signal to a host processor indicating that a particular oscillator cannot be tuned thus giving status information to the host processor.

The frequencies produced by each oscillator are controlled by the indications loaded into the RAM registers corresponding to that oscillator. So, despite sharing control hardware, every oscillator operates independently of every other oscillator. The oscillators may vary in quality, range, stability, accuracy, and phase. The present invention allows each VCO to be tuned to any frequency within its range, regardless of the frequency and frequency range of neighboring VCOs using shared controller circuitry. The first VCO 12-1, for example, could have a range of 5 to 16 MHz and be tuned to $6\frac{1}{4}$Mhz, while the second VCO 12-2 could have a range of 40 to 80 MHz and be tuned to 72 MHz.

The programmable multiple oscillator is made still more flexible by the addition of output selector/buffers 40-1 to 40-8 and divider strings 44-1 to 44-8 as discussed above.

Current circuits are becoming smaller and more portable and minimum power consumption arises is required. Therefore, the select lines 48 may command various power-down modes disabling only certain dividers 44-1 through 44-8 and output selector/buffers 40-1 through 40-8 where fast reenable is desired, or for minimum power consumption additionally may power-down VCOs 10-1 through 10-8 when a longer reenable time is feasible.

The RAM registers 26 in the state machine 24 could be made nonvolatile or some other type of cells. For example, a read only memory (ROM) could be used instead of RAM. In most RAM designs, the values stored in the RAM are lost when power is turned off. This requires that the RAM be reloaded whenever power is turned back on, but RAM is preferred because of its flexibility.

There are several ways to load the state machine's RAM 26. It may be loaded directed from ROM registers connected directly to each RAM register as shown in FIG. 3. This arrangement eliminates the need for the I/O port 38. In common microcomputers, for example, the computer may use only a few different sets of frequencies. If only three sets are required, all three sets of frequencies can be provided with three sets of ROM tables, one for each of the three different sets of frequencies. These can be supplied within the state machine, together with a bus to the RAM from each of the sets of ROM registers. Once it is determined which set of frequencies is desired, a hardwired pin can cause the corresponding ROM set to be loaded into the RAM register during reset or power-up so that the RAM will always correspond to the set of values stored in the selected ROM.

Figure 8:
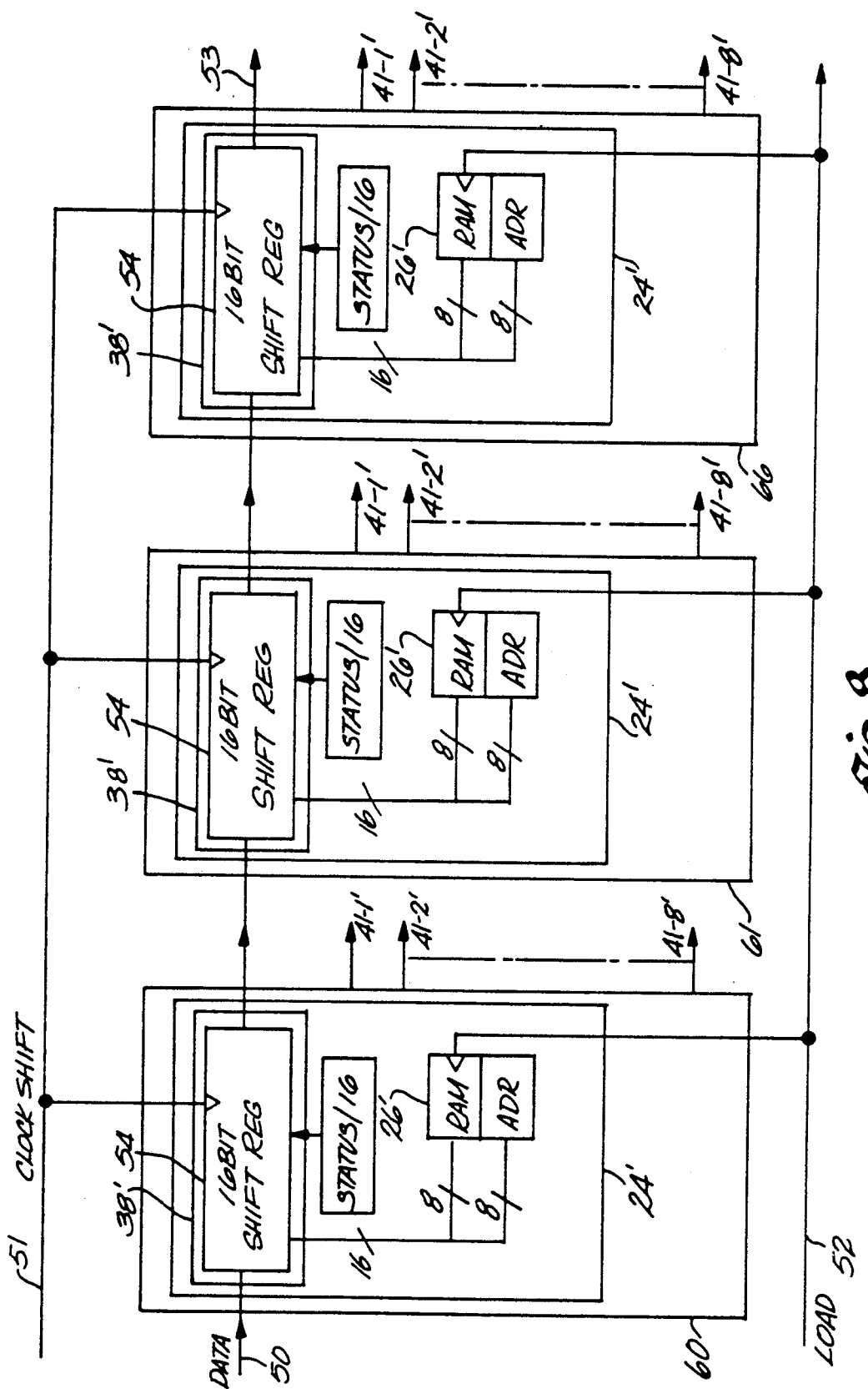
FIG. 8 is a block diagram of an alternate embodiment of the invention in which the I/O ports of three clock signal generators are connected in series.

The RAM may also be set up by an external processing unit. This may be achieved in many different ways, either in serial or parallel through I/O port 38. The block diagram of FIG. 8 depicts an implementation which minimize the number of electrical connections when several programmable multiple oscillators 60, 61, 66. In FIG. 8, the same reference numbers are used to identify essentially the same components as in FIG. 2 with the addition of primes.

A serial one-bit data line 50, a clock shift line 51, and a load line 52 control the RAM registers 26 of three different state machines 24' within three different oscillator control circuits 60, 61 and 66. A serial data line 50 connects the serial I/O port 38' for the first state machine 24' to a host or central processing unit (not shown). The serial I/O port 38 of each programmable multiple oscillator includes 16-bit shift register 54 or buffer. The 16-bit shift register 54 in each of the programmable oscillators are connected from input to output in a series with the input of the register 54 in programmable multiple oscillator 60 connected to data line 50. The state machine of each programmable multiple oscillator has a set of RAM registers 26' for controlling the VCOs within each of its oscillators 10.

An external processing unit or host computer (not shown) sets the values in each RAM 26' by sending 16-bit words in series along the data line 50. As the bits are received, they are shifted through the shift register buffers 54, until all three shift register buffers 54 are filled. The external processing unit then sends a write signal on the load line 52, which commands the I/O ports 38' to transmit the value in each buffer 54 to the corresponding RAM 26'. Each 16-bit word contains an 8-bit address to select the appropriate register in the corresponding RAM 26' for storage of the frequency indication and to control the selection by each of the output selection and buffers 40-1 through 40-8 and an 8-bit value to be stored in that selector and buffer. When the write command issues on the load line 52, the 8-bit address latches the 8-bit data onto one-half of the one of the 16 registers in the corresponding RAM 26' by routing the 8-bit value into that position.

Line 53 out of the last shift register 54 can be connected to the host computer. Status information about the oscillator in the programmable multioscillator can be loaded into the corresponding register 54 and then shifted back to the host computer.

When the computer is first turned on, it will load all 16 registers in all three RAMs 26' and all 8 selector/-buffers 40-1 through 40-8 by repeatedly writing the appropriate values into the corresponding shift register buffer 54. Once the registers are loaded, each of the programmable multioscillators 60, 61, 66 will adjust its oscillators accordingly. The system of FIG. 8 allows the external processor to change the frequency of any of the oscillators controlled by any of the state machines 24' simply by writing a new value into the appropriate register. However, since the serial construction of FIG. 8 requires three RAMs 26', one in each of the state machines be written to at the same time, the host computer must keep track of the values stored in the RAM registers.

Because the external processor can change the clock frequency indications in the RAMs at any time when the computer is running, the clock frequencies can be optimized or adjusted for different jobs. For example, in a microcomputer, the CPU could test a main memory (not shown) to determine how fast it is capable of operating and then set the RAM registers accordingly. The CPU could also poll its expansion slots in a personal computer to determine which frequencies are required and then set the RAM registers. If the peripheral installed in an expansion slot is changed, the CPU can easily change the corresponding clock frequency In this context, the peripheral unit can be any unit outside the programmable multiple oscillator.

All the components, except the memory capacitors 16-1 through 16-8 of the multiple oscillators of FIG. 3 are preferably incorporated into a single integrated circuit chip using techniques well known in the art. The reference oscillator may either be integrated into the chip using stable oscillator circuits well known in the art or pins may be provided to connect an external oscillator, for example, a crystal oscillator. However, it is preferred that a number of pins for external components be minimized to reduce the required space.

FIGS. 9 and 10 are schematic and block diagrams of one embodiment of a switch 18 and memory capacitor 16 forming a sample and hold circuit. Parasitic leakage paths or capacitances are inherent in IC chips shown in FIG. 9. FIG. 10 shows techniques to overcome the leakage paths. The capacitor 16 would not normally be integrated into the same IC chip as the other components because of leakage to the semiconductor substrate. The leakage results in what is commonly referred to as the "droop" rate. The droop rate is improved by using a large external capacitor 16 connected to a P-well 103. Capacitor 16 is then an isolated external capacitor. This provides sufficient capacitance to yield a large enough resistance-capacitance (RC) product against the effective lessening of R with leakages in the IC implementation.

The sample and hold capacitor 16 must preferably maintain its charge to an accuracy of 0.0015% until the state machine 24 has adjusted all the other oscillators. This may take several tens of milliseconds. The current drain to the amplifier 14 is made very low by using as its input a Metal Oxide Semiconductor Field Effect Transistor (MOSFET) 86. The primary source of current drain from the capacitor 16 plates in an IC circuit is leakage through parasitic diodes 81, 82 and 83 to a P-well 103 by the body of FET switch 18. In the following discussion a P-well process is assumed for 103, but it is understood that the techniques are equally applicable to an N-well process also.

In FIGS. 9 and 10, the current drain from the capacitor 16 is indicated as an effective leakage diode 82 connecting node 99 to ground through the P-well 103 while in the hold mode. In addition to the leakage effect, two other effects impair the performance of the sample and hold circuit. Every time the switch 18, preferably implemented in a field effect transistor (FET) 101 is turned on or off, there is a packet of charge coupled through the parasitic capacitance (not shown) of the gate 97 to the node 99. Additionally, node 95 connecting the various switches 18-1 through 18-5 has a parasitic capacitance 94. When FET switch 101 closes to connect node 99 to node 95, parasitic capacitance 94 is likely to be at a different voltage than the memory capacitor 16. Therefore, at the moment of connection, the charges of capacitors 16 and 94 will balance causing an error in the current supplied to the memory capacitor 16 from the current source 22.

FIG. 10 shows three techniques to control the parasitic effects which impair the precision performance required by the sample and hold circuit.

The first technique is guarding the substrate. To control the leakage of diode 82 the P-well 103 is not grounded, but instead is bootstrapped by resistor 92 from the output 100 of buffer amplifier 14. The resistance of resistor 92 is somewhere between the resistance of FET switch 101 when opened and when closed. This reduces the voltage difference across diode 82 to a few millivolts, effectively reducing its leakage several orders of magnitude. The effective leakage resistance is now sufficiently large that capacitor 16 may be integrated into the IC eliminating the need for external connection and package pin 103. Therefore, preferably, the memory capacitor is integrated in the IC chip.

The second technique is pre-charging Due to use of the floating P-well 103 it is necessary to use a second FET switch 84 to isolate node 96 from node 95 and the rest of the generator circuitry. Otherwise, as node 95 drives one of the other sample and holds 18-1 through 18-8 it could forward bias diode 81 and cause errors to accumulate on capacitor 16 by changing the leakage current through diode 82. However, there are now two parasitic capacitors 87 and 94 with charges unknown prior to FET 101 turning on. Therefore, FET 84 is turned on first. An additional resistor 93, coupled to a point between the two FET switches, 84, 101 and the output of the amplifier 14. The resistance of resistor 93 is similar to that of resistor 92 and precharges the parasitic capacitors 87 and 94 to the voltage of node 99 across sample and hold capacitor 16. FET 18 then switches on to connect node 99 to node 96 and to connect thereby node 95 to the current pump consisting of current source 22 and switch 20 through FET 84 which is already on. Since the nodes 95 and 96 are already near the correct voltage of node 99, there will be a minimum disturbance to the voltage on capacitor 16.

The third technique is charge balancing the parasitic capacitance of gate 97, which causes a charge transfer when FET 101 is switched and an error in charge. The error charge is balanced out by using a second FET 85 having W and L set to compensate the charge on node 95 by driving its gate 98 with a reversed polarity waveform.

Figure 11:
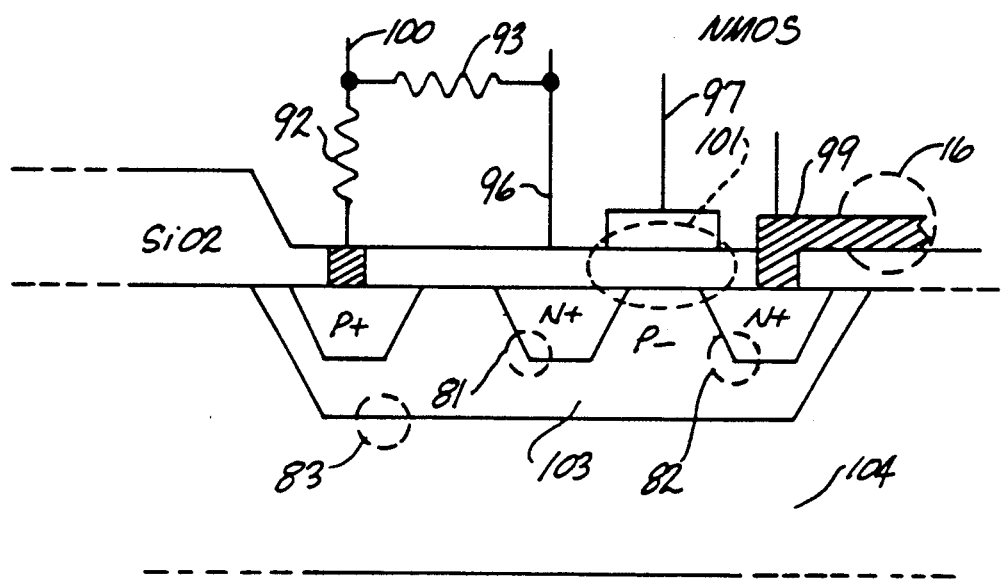
FIG. 11 is a cross sectional view of a portion of the semiconductor chip implementing the circuit of FIG. 10 in a P-well process and with the parasitic leakage diodes.

FIG. 11 illustrates in cross section the IC circuit of FIG. 10 in a one-sided N substrate Complementary Metal Oxide Semiconductor (NMOS) process. Elements are given the same reference numbers used in FIGS. 9 and 10. Effectively the gate capacitance of matched FET switches 101, 85 from FIG. 10, are in parallel. Accordingly, only one FET 101 is shown. The first FET switch 84 is not shown nor is the amplifier 14.

By use of the above techniques, a small totally integrated sample and hold circuit of extreme high accuracy and long hold time is possible. The sample and hold may be adapted to many uses beyond that described here, for example in integrators, and digital to analog converters.

Figure 12:
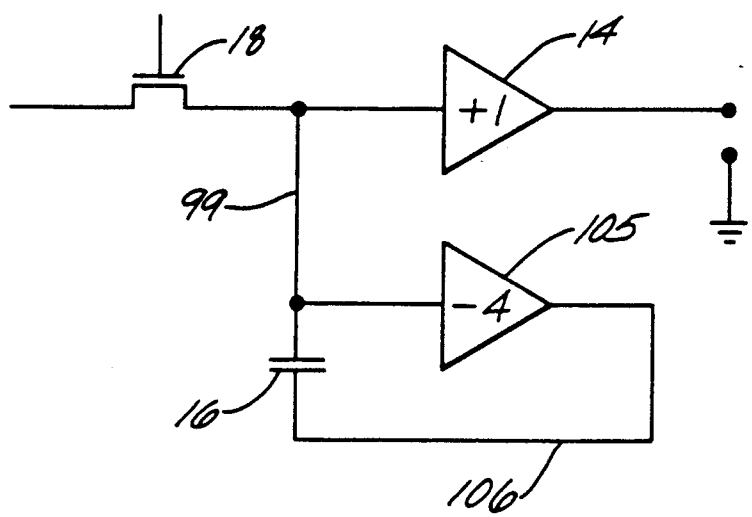
FIG. 12 is a schematic and block diagram of an improved sample and hold capacitor circuit which allows a reduction in the size of the capacitor needed in the capacitor memory.

FIG. 12 shows a method of reducing the silicon area necessary for the memory capacitors 16. In order to obtain sufficient capacitance for the memory capacitor 16, a large amount of silicon area is necessary, some 60 times the amount of area necessary for the associated amplifier 14. A second inverting amplifier 105 is used as a capacitance multiplier in order to reduce the size of capacitor 16. Assume that the required voltage range on node 99 is 2 volts to 3 volts, a 1 volt range. Amplifier 105 has a fixed gain of 4 and biased such that its output has a range of 0.5 volts to 4.5 volts, easily obtainable with CMOS running from a VCC of 5 volts. Then the amplifier 105 multiplies the capacitance of the memory capacitor 16 by its gain plus 1. As a result, the total capacitance required for capacitor 16 is 1/5 times the non-multiplied amount. The silicon area savings are 12+1+1 versus 60+1 or about 77%.

While the description above is limited to only a few variations on one embodiment of the present invention, it should be appreciated that many other modifications and adaptations are possible without departing from the spirit and scope of the present invention.

What is claimed is:

1. A programmable source of a plurality of strings of clock signals comprising:
   an oscillator and an oscillator memory corresponding to each string of clock signals, each oscillator forming the corresponding string of clock signals with a frequency in accordance with the storage content of the corresponding oscillator memory;
   a program memory for simultaneously storing, for each string of clock signals, at least one indication, of a desired frequency of the corresponding string of clock signals;
   a source of reference timing signals; and
   a controller for scanning each oscillator memory and, for each oscillator memory scanned, adjusting the memory content thereof in accordance with the corresponding indication of a desired frequency, the corresponding string of clock signals and the reference timing signal.

2. A source of clock signals according to claim 1 wherein the controller comprises means for adjusting the storage content of said oscillator memories and a switching circuit for coupling the means for adjusting to each of the oscillator memories.

3. A source of clock signals according to claim 1 wherein the controller comprises a comparator for comparing the frequency of any of said strings of clock signals with the reference timing signals.

4. A source of clock signals according to claim 1 wherein the controller comprises a comparator for comparing, for each of the oscillators, the frequency of the clock signals therefrom with a frequency of the reference signal and means for adjusting the memory content of the oscillator memory, corresponding to each such oscillator, in accordance with the result of such comparison and the corresponding at least one indication.

5. A source of clock signals according to claim 1 comprising a comparator for comparing the number of clock signals from each oscillator occurring during a time period with the reference signals and means for adjusting the memory content of the oscillator memory, corresponding to such oscillator, in accordance with the result of said comparison and the at least one indication for such oscillator.

6. A source of clock signals according to claim 5 wherein the comparator comprises a counter for counting the clock signals from the corresponding oscillator.

7. A source of clock signals according to claim 1 comprising, for each oscillator, a sample and hold circuit which comprises the corresponding oscillator memory.

8. A source of clock signals according to claim 1 wherein each said oscillator memory comprise a capacitor memory circuit.

9. A source of clock signals according to claim 8 wherein the controller comprises a source of charging signals for the capacitor memory circuits.

10. A source of clock signals according to claim 8 comprising a switching circuit for sequentially coupling the source of charging signals to the capacitor memory circuits of the oscillator memories.

11. A source of clock signals according to claim 10 wherein the source of charging signals comprises means for either selectively charging or discharging the capacitor memory circuits.

12. A source of clock signals according to claim 8 comprising an amplifier for each capacitor memory for buffering the output of such capacitor memory.

13. A source of clock signals according to claim 1 wherein each said oscillator comprises a voltage controlled oscillator, the frequency of which is adjusted in accordance with the corresponding oscillator memory.

14. A source of clock signals according to claim 9 wherein the controller comprises a counter for counting the clock signals from any of the oscillators, means for adjusting said counter in accordance with the indications of a desired frequency for such oscillator, means for controlling a period of time during which the counter counts in accordance with said reference signals, means responsive to the counter for controlling the charging and discharging by the capacitor charging circuit.

15. The source of clock signals according to claim 2 wherein the oscillators, the switching circuits and the controller are all formed in a common integrated circuit chip.

16. The source of clock signals according to claim 15 wherein the oscillator memory is also formed in the common integrated circuit chip.

17. A source of clock signals according to claim 1 comprising a further memory containing initial indications of desired frequencies, the controller being operative for selectively loading the initial indications into the program memory 18. A source of clock signals according to claim 17 wherein the further memory comprises a stored indication of a desired frequency for each of a plurality of said oscillators and the controller selectively loads the indications into a corresponding location in said program memory.

19. A source of clock signals according to claim 1 comprising a frequency divider coupled to the output of each oscillator.

20. A source of clock signals according to claim 19 comprising a signal selector coupled to the frequency divider.

21. A source of clock signals according to claim 8 wherein the capacitor memories each comprise at least one capacitor, an amplifier coupled for amplifying the signal across the at least one capacitor for increasing the apparent effective capacitance thereof.

22. A source of clock signals according to claim 1 wherein the controller comprises coarse and fine tune adjustment means for the memory content of the oscillator memories.

23. A source of clock signals according to claim 1 wherein the controller comprises
coarse tune adjustment means for making a coarse adjustment in the memory content of an oscillator memory in accordance with a coarse tune signal derived at least in part from one of the indications of a desired frequency, and
fine tune adjustment means for making further fine tune adjustment in the memory content of the same oscillator memory in accordance with a coarse tune signal derived at least in part from the same indication of a desired frequency.

24. A source of clock signals according to claim 23 comprising means enabling the coarse tune adjustment means to adjust the memory content of one of the oscillator memories until the frequency of the string of clock signals from the corresponding oscillator is within a predetermined deviation from the desired frequency and then enabling the fine tun adjustment means to adjust the memory content of the same oscillator memory.

25. A plurality of programmable oscillators each for providing a source of a plurality of strings of clock signals, each programmable oscillator comprising
an oscillator and an oscillator memory corresponding to each string of clock signals, each oscillator forming the corresponding string of clock signals with a frequency in accordance with the storage content of the corresponding oscillator memory;
a program memory for simultaneously storing, for each string of clock signals, at least one indication of a desired frequency of the corresponding string of clock signals;
a source of reference timing signals;
a controller for sequentially scanning the oscillator memories and, for each oscillator memory scanned, adjusting the memory content thereof in accordance with the corresponding indication of a desired frequency, the corresponding string of clock signals and the reference timing signal; and
a port for transferring the indications of the desired frequencies to the program memory from an external device.

26. The plurality of programmable oscillators according to claim 25 wherein the ports are serially connected together.

27. The plurality of programmable oscillators according to claim 26 comprising means for loading the indications for each of the program memories through the corresponding ports and means for providing a confirmation of the frequency indications stored in the program memory back through the corresponding port.

28. The plurality of programmable oscillators according to claim 26 wherein each port has an output port for providing status information from the corresponding programmable oscillator.

29. A method for controlling a programmable source of a plurality of string of clock signals, the steps comprising
storing a program comprising a plurality of different indications of desired frequencies, each said indication corresponding to one of said strings of clock signals;
operating the frequency of each of a plurality of oscillators in accordance with the memory content of a separate memory for each such oscillator, each such oscillator thereby forming a different one of said strings; and
adjusting the memory content of the memory for an oscillator in accordance with the corresponding string, the corresponding indication of a desired frequency and reference signals.

30. The method of claim 29 comprising the step of scanning the oscillators in a sequence and adjusting the memory content of the memory corresponding to the oscillator being scanned.

31. The method of claim 30 wherein the step of adjusting comprises
a coarse tune cycle for using the frequency indicated by a coarse frequency indication for making a coarse adjustment in memory content of the memory for the corresponding oscillator, and a fine tune cycle for using the frequency indicated by a fine frequency indication and making an adjustment in the memory content of the memory for the corresponding oscillator.

32. The method of claim 31 comprising the step of changing from a coarse to a fine tune cycle for the memory of an oscillator when the frequency is within a predetermined value of the frequency indicated by the coarse tune cycle indication.

33. A clock pulse generator for generating a plurality of pulse strings, the frequency of the pulses in each pulse string being individually controllable, the generator comprising:

a controllable pulse string source, corresponding to each such pulse string, for providing the corresponding pulse string;

a memory corresponding to each pulse string source, each pulse string having a frequency corresponding to a storage content in the corresponding memory;

a source of reference signals; and a frequency controller responsive to a separate indication of a desired frequency for each of said pulse strings, an indication of the actual frequency of each of said pulse strings and the reference signals for establishing the storage content in each said memory, each said memory thereby causing the corresponding source to adjust the series of regular recurring pulses towards the desired frequency in the corresponding pulse string.

34. The pulse generator of claim 33 comprising a register for each said pulse string for storing the corresponding desired frequency indication.

35. The generator of claim 34 wherein the registers comprises at least one random access memory and the generator further comprises a read only memory connected to the random access memory for supplying the frequency indications to the random access memory.

36. The pulse generator of claim 35 wherein the read only memory comprises a plurality of indications for each random access memory.

37. The pulse generator of claim 34 wherein the controller comprises a comparator for comparing the frequency of the pulses in each said pulse string with the reference signal.

38. The pulse generator of claim 37 wherein the comparator comprises a counter for counting the pulses in each said pulse string.

39. The pulse generator of claim 38 wherein the controller sets the counter, before counting, in accordance with the desired frequency indication for each pulse string.

40. The pulse generator of claim 33 wherein the controller comprises means for sequentially and repeatedly adjusting the storage content of each said memory.

41. The pulse generator of claim 33 wherein the controller comprises a programmable controller.

42. The pulse generator of claim 33 comprising a sample and hold circuit for each said pulse string source which comprises each said memory.

43. The pulse generator of claim 33 wherein each said source comprises a controlled variable frequency oscillator.

44. The pulse generator of claim 33 wherein the memory comprises an analog memory.

45. A clock pulse generator comprising:

a plurality of oscillators each for producing a serial string of electrical pulses at its respective output, means for providing a signal, for each oscillator indicative of a desired frequency;

a memory corresponding to each oscillator for controlling the frequency of the oscillator;

a comparator for comparing the number of pulses produced by each one of the oscillators with a frequency reference; and means for changing the memory content of each memory in accordance with the result of the comparison and one of the signals indicative of a desired frequency.

46. The generator of claim 45 comprising a counter, a time base gate responsive to such frequency reference for measuring a selected time interval, the gate opening to allow pulses from one of the oscillators to be counted by the counter, and then closing to prevent the counting of oscillator pulses after the time interval has elapsed.

47. The generator of claim 46 wherein the frequency reference comprises an oscillator.

48. The generator of claim 47 wherein the reference comprises a quartz crystal oscillator.

49. The generator of claim 45 wherein the recited elements of the generator are formed in a single integrated circuit chip.

50. The generator of claim 45 wherein the stored number is a function of the a residual count of the number of pulses desired to be produced.

51. The generator of claim 45 comprising, for each said pulse string, a sample and hold capacitor circuit which comprises the corresponding memory.

52. The generator of claim 51 wherein the sample and hold circuit comprises a capacitor, wherein each oscillator comprises a voltage controlled oscillator and an amplifier for controlling the voltage controlled oscillator, the amplifier having an input coupled to the capacitor of the corresponding memory, a semiconductor gate for regulating the charge on the capacitor.

53. The generator of claim 52 comprising a switch for each memory for coupling the source to the capacitors of such memory, and at least one resistance for coupling each amplifier output back to precharge any parasitic capacitance of the switch for the corresponding memory.

54. The generator of claim 53 wherein the gate, capacitor, and amplifier are all formed on a common semiconductor substrate.

55. The generator of claim 51 wherein each of the oscillators comprise a voltage controlled oscillator and an amplifier for controlling the voltage controlled oscillator, an input of the oscillator being coupled to the capacitor; and a field effect transistor switch pair for regulating the charge on the capacitor.

56. The generator of claim 55 wherein each of the switch pairs and capacitor are formed on a common semiconductor substrate.

57. The generator of claim 51 wherein each of the oscillators comprises a voltage controlled oscillator and an amplifier for controlling the oscillator, an input of the amplifier being coupled to the capacitor.

58. The generator of claim 57 wherein the gate, capacitor and amplifiers are all formed on a common semiconductor substrate through a common doped well; and an output of the amplifier is connected to a common doped well to bias the well against capacitor leakage.

59. The generator of claim 45 comprising a state machine for providing the signals indicative of a desired frequency.

60. The generator of claim 57 comprising a programmably settable register for each oscillator for storing each signal indicative of a desired frequency.

61. The generator of claim 51 wherein each sample and hold circuit each comprises a capacitor and a gate and further comprising a current source, the gate coupling between the current source and the corresponding capacitor.

62. The generator of claim 45 comprising a divider string with a series of tap points and an output selector for selecting a tap point on the string, and thereby effectively selecting a stream of pulses lower in frequency than the oscillator output.

63. The generator of claim 62 wherein the divider string comprises a sequence of flip-flops.

64. A stable integrated sample and hold circuit on a semiconductor substrate comprising an operational amplifier having an input and an output;

a capacitor, one plate of which is in communication with the amplifier input and the other plate of which is in communication with the semiconductor substrate;

a current source for supplying current to charge the capacitor;

at least two switches connected between a current regulator and the current source for regulating the current supplied by the current source; and a loop back connection between the amplifier output to a location between the two switches for biasing the voltage of the location.

65. The circuit of claim 64 wherein the capacitor and switches share a common doped well, the circuit further comprising a loopback line connecting the amplifier output to the well.

66. The circuit of claim 64 wherein one of the switches comprises a field effect transistor pair, the first transistor of the pair being responsive to signals of one polarity for opening its gate and the second transistor of the pair providing a matched charge of opposite polarity to the common connection between the pair.

* * * * *

UNITED STATES PATENT AND TRADEMARK OFFICE
CERTIFICATE OF CORRECTION

PATENT NO. : 4,998,075  
DATED : March 5, 1991  
INVENTOR(S) : C.R. Patton, III; T.G. O'Shaughnessy It is certified that error appears in the above-identified patent and that said Letters Patent is hereby corrected as shown below:

Column 1, line 62, after "strings" insert a period.

Column 3, line 20, after "(not shown)" insert a period.
Column 3, line 33, change "Megahertz" to -- megahertz --.
Column 3, line 48, after "circuits" change "30" to -- 310 --.

Column 4, line 28, after "Chip" insert a period.
Column 4, line 41, delete the comma after "314".
Column 4, line 53, after "Chip" insert a period.
Column 4, line 62, after "conventions" insert a period.
Column 4, line 64, delete the comma after "345".
Column 4, line 66, delete the comma after "display".

Column 5, lines 5,6, change "mathcoprocessor" to -- math coprocessor --.
Column 5, line 6, before "Intel" delete "the".
Column 5, line 18, delete the first occurrence of "and" and insert therefor a comma.
Column 5, line 33, after "FIG. 3" delete "and".
Column 5, line 44, change "Filed" to -- filed --.

Column 6, line 35, change "Megahertz" to -- megahertz --.

Column 7, line 50, after "port" insert a period.

Column 8, line 10, change "I" to -- 1 --.

UNITED STATES PATENT AND TRADEMARK OFFICE
CERTIFICATE OF CORRECTION

PATENT NO. : 4,998,075

DATED : March 5, 1991

INVENTOR(S) : C.R. Patton, III; T.G. O'Shaughnessy

It is certified that error appears in the above-identified patent and that said Letters Patent is hereby corrected as shown below:

```
Column 9,  line 29, after "performance" delete "but".
Column 9,  line 49, after "28" delete "and".

Column 11, line 31, after "sets" delete "an".
Column 11, line 52, change "turning" to -- tuning --.

Column 12, line 33, after "consumption" delete "arises".

Column 13, line 2,  change "minimize" to -- minimizes --.
Column 13, line 3,  before "several" change "when" to
                    -- with --.
Column 13, line 37, before "one" delete "the".
Column 13, line 57, after "machines" insert a comma.

Column 14, line 3,  after "frequency" insert a period.

Column 15, line 11, after "precharging" insert a period.
Column 15, line 15, change "sample" to -- samples --.
Column 15, line 35, change "in charge" to -- is charged --.
```

UNITED STATES PATENT AND TRADEMARK OFFICE
CERTIFICATE OF CORRECTION

PATENT NO. : 4,998,075

DATED : March 5, 1991

INVENTOR(S) : C.R. Patton, III; T.G. O'Shaughnessy

It is certified that error appears in the above-identified patent and that said Letters Patent is hereby corrected as shown below:

Column 16, line 62, change "comprise" to -- comprises --.

Column 17, line 58, after "comprises" insert a colon.

Column 18, line 7, change "tun" to -- tune --.
Column 18, lines 12,47, after "comprising" insert a colon (both occurrences).
Column 18, line 66, after "comprises" insert a colon.

Column 19, line 7, insert a colon after "comprising".

Column 20, line 29, before "residual" delete "a".
Column 20, line 52, change "comprise" to -- comprises: --.

Column 21, line 13, insert a colon after "comprises".
Column 21, line 25, insert a colon after "comprising".

Signed and Sealed this

Eighth Day of December, 1992

Attest:

DOUGLAS B. COMER

Attesting Officer

Acting Commissioner of Patents and Trademarks